US007259437B2

(12) United States Patent
Nguyen Van Dau

(10) Patent No.: US 7,259,437 B2
(45) Date of Patent: Aug. 21, 2007

(54) HIGH PERFORMANCE SPIN-VALVE TRANSISTOR

(75) Inventor: Frédéric Nguyen Van Dau, Palaiseau (FR)

(73) Assignee: Thales, Neuilly-sur-Seine (FR)

( * ) Notice: Subject to any disclaimer, the term of this patent is extended or adjusted under 35 U.S.C. 154(b) by 0 days.

(21) Appl. No.: 10/538,923

(22) PCT Filed: Nov. 24, 2003

(86) PCT No.: PCT/EP03/50886

§ 371 (c)(1),
(2), (4) Date: Jun. 13, 2005

(87) PCT Pub. No.: WO2004/055901

PCT Pub. Date: Jul. 1, 2004

(65) Prior Publication Data
US 2006/0049474 A1    Mar. 9, 2006

(30) Foreign Application Priority Data
Dec. 13, 2002  (FR) .................................. 02 15845

(51) Int. Cl.
*H01L 29/82* (2006.01)

(52) U.S. Cl. ............... 257/421; 257/427; 257/E29.042; 257/E29.323

(58) Field of Classification Search ............ 360/324.1, 360/324.11, 324.12, 324.2, 314; 257/423, 257/427, 421, E29.042, E29.167, E29.006, 257/E29.179, E29.241, E29.323, 38, 47, 257/474, 479, E27.006, E29.185
See application file for complete search history.

(56) References Cited

U.S. PATENT DOCUMENTS

| | | | | | |
|---|---|---|---|---|---|
| 3,979,613 | A | * | 9/1976 | Kroger et al. | 327/530 |
| 4,575,741 | A | * | 3/1986 | Frank | 257/35 |
| 5,371,378 | A | * | 12/1994 | Das | 257/77 |
| 5,747,859 | A | * | 5/1998 | Mizushima et al. | 257/421 |
| 6,069,820 | A | | 5/2000 | Inomata et al. | |

(Continued)

FOREIGN PATENT DOCUMENTS

| JP | 2002 329902 A | 11/2000 |
|---|---|---|
| JP | 2002 305335 A | 2/2003 |

OTHER PUBLICATIONS

Dijken Van S et al: "Room temperature operation of a high output current magnetic tunnel transistor" Applied physics letters, American Institute of Physics, NY May 6, 2002 pp. 3364-3366.

(Continued)

*Primary Examiner*—Minhloan Tran
*Assistant Examiner*—Benjamin Tzu-Hung Liu
(74) *Attorney, Agent, or Firm*—Lowe Hauptman & Berner, LLP

(57) ABSTRACT

The invention generally relates to the field of spintronics, a branch of electronics using the magnetic spin properties of electrons. More particularly, the invention relates to the field of spin-valve transistors which can be used in numerous fields of electronics. The invention aims to propose an original arrangement for producing high-level and high-contrast collector currents simultaneously. The inventive spintronics transistor comprises a semiconductor emitter, a base fanning a spin valve and a metallic collector separated from the base by an insulating deposit. The emitter/base interface constitutes a Schottky barrier and the base/collector interface constitutes a tunnel-effect barrier.

8 Claims, 7 Drawing Sheets

U.S. PATENT DOCUMENTS

| | | | |
|---|---|---|---|
| 2002/0121647 A1* | 9/2002 | Taylor | 257/192 |
| 2003/0122208 A1 | 7/2003 | Sato et al. | |
| 2003/0214004 A1 | 11/2003 | Sato et al. | |

OTHER PUBLICATIONS

Monsma D J et al: "Perpendicular Hot Electron Spin-Valve Effect in a New Magnetic Field Sensor: The Spin-Valve Transistor" Physical Review Letters, NY Jun. 26, 1995 pp. 5260-5263.

Kumar P S et al: "The spin-valve transistor" Journal of Physics D (Applied physics) Nov. 21, 2000 IOP Publishing, UK.

Sato R et al: "Spin-Valve Transistor Formed on Gaas (001) Substrate" IEEE Transactions on Magnetics, IEEE Inc. NY US Sep. 2002 pp. 2863-2868.

M. Guth et al "Tunnel magnetoresistance in magnetic tunnel junctions with a ZnS barrier" Applied Physics Letters May 28, 2001.

P. Rottlander et al "Tantalum oxide as an alternative low height tunnel barrier in magnetic junctions" Applied Physics Letters May 21, 2001.

* cited by examiner

P configuration

AP configuration

HIGH PERFORMANCE SPIN-VALVE TRANSISTOR

CROSS-REFERENCE TO RELATED APPLICATIONS

The present Application is based on International Application No. PCT/EP2003/050886, filed on Nov. 24, 2003, which in turn corresponds to FR 02/15845 filed on Dec. 13, 2002, and priority is hereby claimed under 35 USC §119 based on these applications. Each of these applications are hereby incorporated by reference in their entirety into the present application.

1. Field of the Invention

The invention generally relates to the field of spintronics, a branch of electronics using the magnetic spin properties of electrons. More particularly, the invention relates to the field of spin-valve transistors which can be used in numerous fields of electronics, either as an individual component (logic gate, non-volatile memory element, etc.), or as a magneto-resistive sensor in numerous fields (automotive, instrumentation, drilling and navigation), or even as a read head supporting high-capacity magnetic recording (recording densities greater than a terabit/inch$^2$).

2. Description of the Prior Art

In a ferromagnetic body, the diffusion of the electrons differs according to their spin. This effect is used in magnetic multilayer devices which are also called spin-valve devices for creating a giant magnetoresistance effect.

Its principle is represented in FIGS. 1a and 1c. A spin valve comprises three successive layers of materials. The first layer F1 is a layer of ferromagnetic metal with imposed magnetization. The second layer N is a layer of non-magnetic metal separating the first layer from the third. The third layer F2 is a layer of ferromagnetic metal with variable magnetization. The operating principle is as follows: if the spin valve is subjected to a magnetic field H, the latter is sufficient to modify the direction of magnetization of the second layer without affecting that of the first layer. The imposed magnetization of the second layer F2 then remains after the magnetic field H has been removed. Depending on the direction of the magnetic field applied, the first and the third layer are then either in a parallel configuration (FIG. 1a), with both magnetizations pointing in the same direction (black vertical arrows in FIG. 1a), or in anti-parallel configuration (FIG. 1c), with the two magnetizations pointing in opposite directions (black vertical arrows in FIG. 1c).

In the parallel configuration, the +½ spin electrons e$^-$ (top oblique arrow in FIG. 1a) pass through the layers F1 and F2 with a weak diffusion. The resistances R+$_{F1}$ and R+$_{F2}$ of the layers F1 and F2 therefore have a low value r for these electrons. The −½ spin electrons e$^-$ (bottom zig-zag arrow in FIG. 1A) pass through the layers F1 and F2 with a strong diffusion. The resistances R−$_{F1}$ and R−$_{F2}$ of the layers F1 and F2 therefore have a high value R for these electrons. Finally, the equivalent electrical resistance of the spin valve is represented in the diagram of FIG. 1b. It is equivalent to two series resistors of valve r placed in parallel with two series resistors of value R. If R is very high compared to r, the equivalent resistance of the circuit is approximately r.

In the anti-parallel configuration, the +½ spin electrons e$^-$ (top arrow in FIG. 1c) pass through the layer F1 with a weak diffusion (straight-line part of top arrow) and the layer F2 with a strong diffusion (zig-zag part of top arrow). The resistance R+$_{F1}$ of the layer F1 therefore has a low value r for these electrons and the resistance R+$_{F2}$ of the layer F2 has a high value R. The −½ spin electrons e$^-$ (bottom arrow of FIG. 1c) pass through the layer F1 with a strong diffusion (zig-zag part of bottom arrow) and the layer F2 with a weak diffusion (straight-line part of bottom arrow). The resistance R−$_{F1}$ of the layer F1 therefore has a high value R for these electrons and the resistance R−$_{F2}$ of the layer F2 has a low value r. Finally, the equivalent electrical resistance of the spin valve is represented in the diagram of FIG. 1d. It is equivalent to two resistors respectively of value r and R placed in parallel with two resistors also of values r and R. If R is very high compared to r, the equivalent resistance of the circuit is now approximately R.

The value of the equivalent resistance of the spin valve is thus modified according to the magnetic field applied.

One of the main areas of research in spintronics is in the development of spin-valve transistors. The spin-valve transistors offer major advantages over conventional semiconductor transistors such as, for example, a low switching time, low energies involved and the possibility of programming logic gates.

Various designs have been proposed since 1995. To illustrate these designs represented in FIGS. 2, 3 and 4, a symbolic notation is used to represent the different layers of the transistor. The symbols used are as follows:

Layer F1 of ferromagnetic metal with permanent magnetization: rectangle with a single arrow.

Layer F2 of ferromagnetic metal with variable magnetization dependent on the magnetic field: rectangle with two arrows head-to-tail.

Layer N of non-magnetic metal: empty rectangle.

Semiconductor layer presenting an electronic Schottky barrier: rectangle topped by a spiked curve, symbolizing the Schottky barrier.

Insulating layer I: lozenge with vertical sides.

The vertical disposition of the different layers is representative of the potential differences applied. Two layers situated at different heights are therefore subject to a potential difference. V$_{EB}$ is used to denote the potential difference existing between the emitter and the base and V$_{BC}$ the potential difference existing between the base and the collector.

In 1995, a first concept was proposed (D. J. Monsma, J. C. Lodder, T. J. A. Popma and B. Dieny—Perpendicular Hot Electron Spin-Valve Effect in a New Magnetic Field Sensor: The Spin-Valve Transistor—Physical review Letters—Vol. 74, No. 26, Jun. 1995). This concept is represented in FIG. 2. The proposed transistor comprises an emitter E of semiconductor material, a metallic base B with three layers F1, N and F2 forming a spin valve and a collector C also of semiconductor material. The emitter/base and base/collector junctions are of Schottky type as indicated in FIG. 2. The arrow indicates the direction of the collected current. It is opposite to the direction of electron propagation. Electrons are injected from the emitter to the base through the base. Some of these electrons, called hot electrons, have sufficiently high energy to pass through the emitter/base Schottky junction. The energy relaxation of these hot electrons in the metallic base depends on their spin. The collected current I$_C$ strongly depends on the relative orientation of the magnetizations between the layers F1 and F2. The term magneto-current contrast MC is used to describe the following ratio:

$$MC = (I_{C,P} - I_{C,AP})/(I_{C,P} + I_{C,AP})$$

with $I_{C,P}$ being the maximum current transmitted when the magnetizations are in parallel configuration and $I_{C,AP}$ the minimum current transmitted when the magnetizations are in anti-parallel configuration.

Strong collector current $I_C$ contrasts have been observed with such a device (P. S. A. Kumar et al., Physica C350, 166 (2001)).

However, the relaxation effects of the electrons in the base are significant, the latter comprising a number of successive interfaces, and, on the other hand, the energy of the electrons depends on the potential barrier level difference between the two emitter/base and base/collector Schottky junctions. Now, it is technologically very difficult to produce significant Schottky junction level differences (greater than 1 eV). Thus, this device can generate only very low-level collector currents, of around 10 nA.

In 2001, a second spin-valve transistor concept was proposed (S. van Dijken, Xin Jiang, and S. S. P. Parkin—room temperature operation of a high output current magnetic tunnel transistor—Applied Physics. Letters—Vol. 80, No. 18-6 May 2002). This so-called MTT (for Magnetic Tunnel Transistor) transistor is represented in FIG. 3. It comprises an emitter consisting of a ferromagnetic layer F1 with permanent magnetization, an insulator I, a base B consisting of a ferromagnetic layer F2 with variable magnetization and a collector C of semiconductor material. The base/collector junction is of Schottky type as is indicated in FIG. 3. The potential differences $V_{EB}$ and $V_{BC}$ required between the base and the emitter and the base and the collector are also represented. The spin-polarized electrons are emitted from the ferromagnetic emitter E by tunnel effect in the ferromagnetic base B. The MTT can be used to limit the relaxation effects of the electrons in the base which is now formed by only a single layer. Higher-level currents $I_C$ at the output of the collector are then obtained. However, the magnetic tunnel junction configuration leads to lower contrasts in current $I_C$ between parallel and anti-parallel magnetization configurations (less than 70%). This results from the fact that this device does not exploit the spin-dependency of the characteristic relaxation length of the hot electrons.

Finally, in 2002, a variant of the MTT was proposed (S. S. P. Parkin—Intermag Europe Conference—Amsterdam—May 2002). This is represented in FIG. 4. It comprises an emitter E of semiconductor material, an insulator I, a base B which is a spin valve comprising three metallic layers F1, N and F2 and a collector of semiconductor material. The base/collector junction is of Schottky type. The emitter emits, by tunnel effect, non-spin-polarized electrons towards the spin-valve structure of the base B. Very high collector current contrasts (greater than 3000%) have been observed with this structure. However, the voltage $V_{EB}$ that can be applied between the emitter and the base is limited by the breakdown phenomenon in the tunnel barrier and consequently limits the intensity of the emitter current $I_E$. The level of the collector current $I_C$ which is proportional to the level of the emitter current $I_E$ also remains limited.

SUMMARY OF THE INVENTION

The object of the invention is to provide a new spin-valve transistor arrangement with which to produce both a high-level and high-contrast collector current $I_C$, which is desirable for sensor type applications (weak field detectors or read heads) or as non-volatile memory element or even as programmable logic gate.

More specifically, the subject of the invention is a spin-valve transistor comprising an emitter, a base and a collector, the emitter being made of a semiconductor material, the base comprising three successive metal layers, the first layer and the third layer being ferromagnetic, the second layer not being ferromagnetic, the interface between the emitter and the layers of the base forming a Schottky diode, characterized in that the collector is metallic and separated from the base by a thin insulating layer of approximately a few nanometers, said layer forming a tunnel-effect barrier between the base and said collector.

Advantageously, the insulating layer presents a lower-level potential barrier than the potential barrier of the Schottky diode existing between the emitter and the base.

Advantageously, said insulating layer is made of tantalum oxide or of zinc sulfide or of zirconium oxide or of a rare earth oxide such as yttrium oxide.

Advantageously, the insulating layer has a thickness of approximately between 1 and 4 nanometers.

Advantageously, the emitter comprises at least one layer of semiconductor material and the collector at least a first layer of metallic material, the layer of semiconductor material of the emitter comprises at least a second layer of metallic material for connecting electrical connection means. These electrical connection means are implanted on the level of the first layer of metallic material, on the level of the second layer of metallic material and of any one of the layers of the base, said connection means being used to apply external voltages and currents to the transistor.

Finally, the electrical voltage applied between the emitter and the base via the connection means is advantageously greater than the potential barrier of the insulating layer.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description thereof are to be regarded as illustrative in nature, and not as restrictive.

BRIEF DESCRIPTION OF THE DRAWINGS

The invention will be better understood, and other advantages will become apparent, from reading the description which follows, given as a nonlimiting example and with reference to the appended figures in which.

DETAILED DESCRIPTION OF THE INVENTION

Figure 1A:
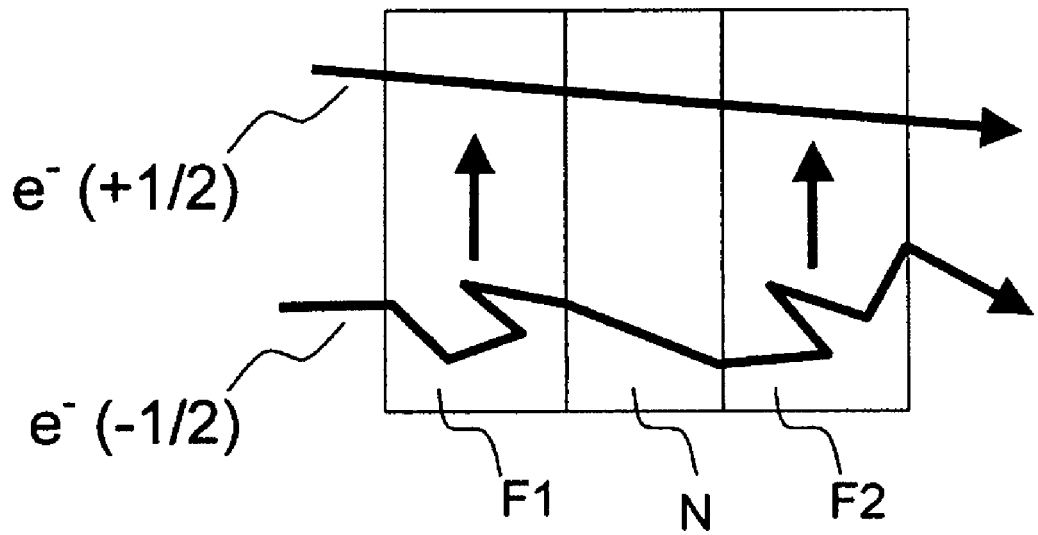
FIGS. 1a, 1b, 1c and 1d represent schematic diagrams of a spin valve and equivalent circuit diagrams in the parallel and anti-parallel states.
Figure 1B:
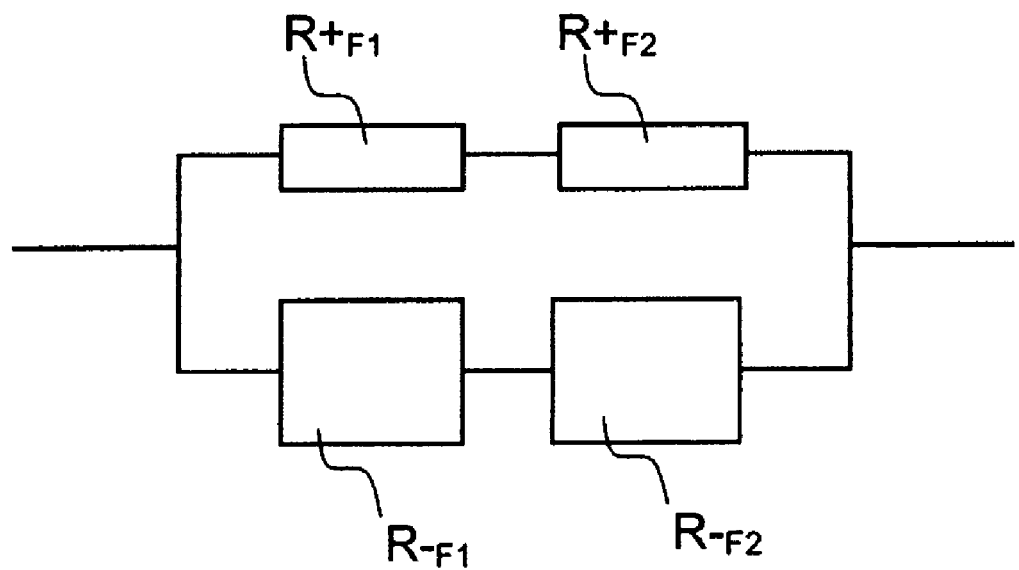
Figure 1C:
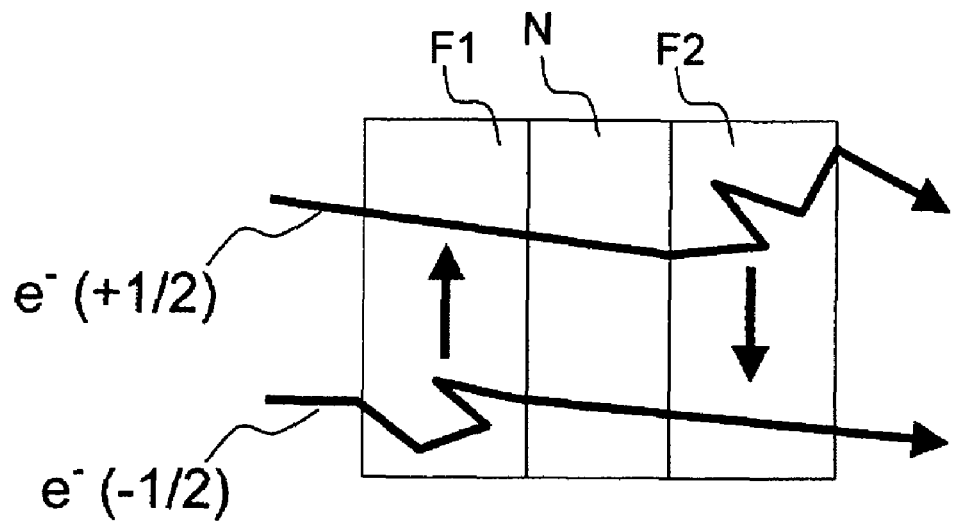
Figure 1D:
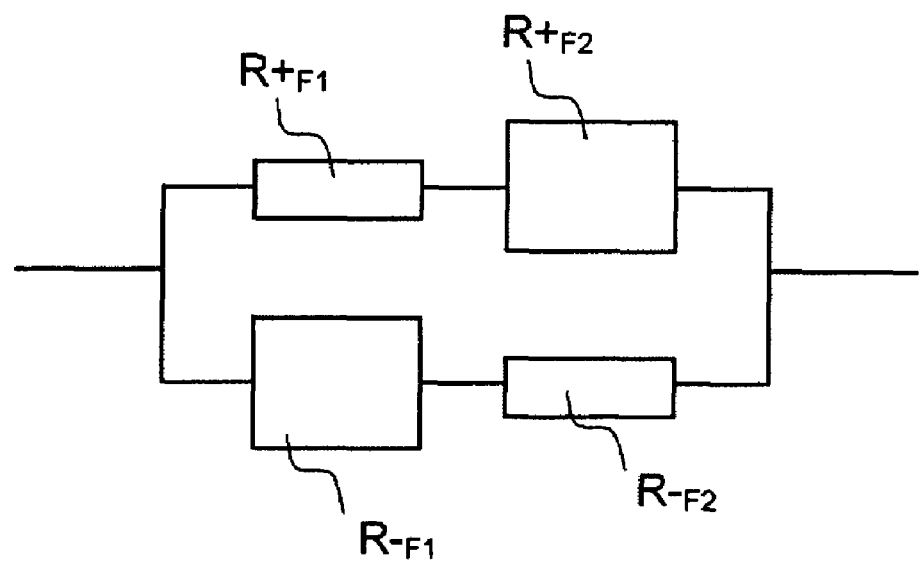
Figure 2:
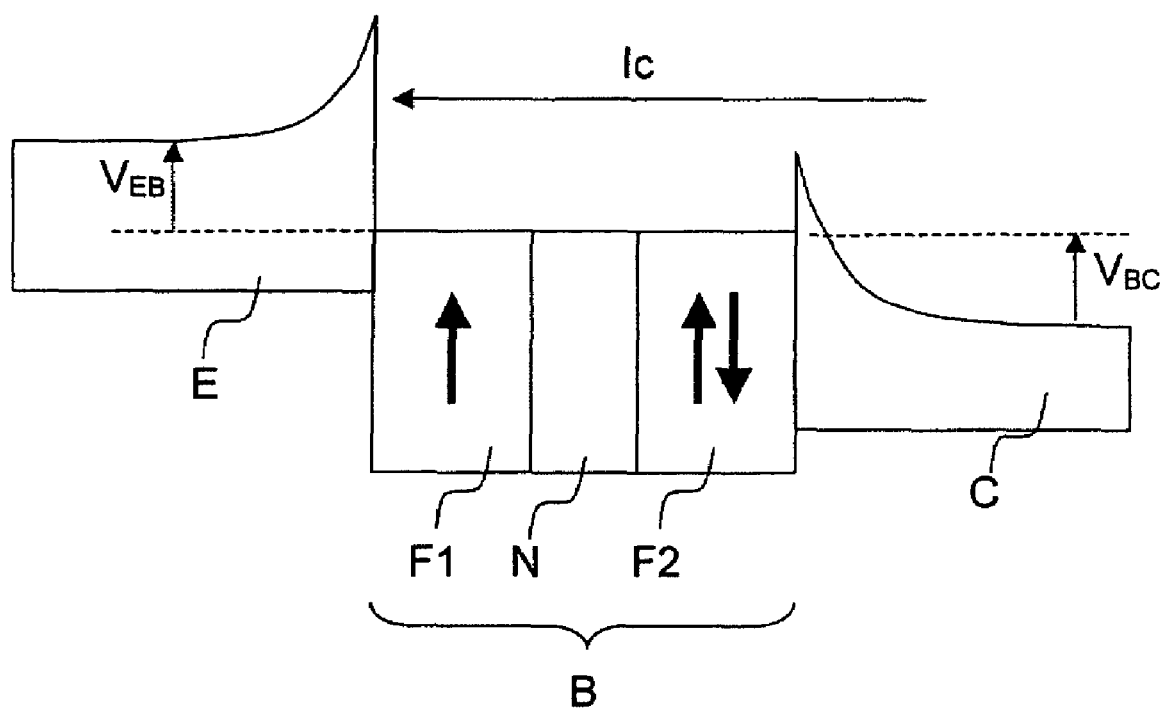
FIG. 2 represents the symbolic diagram of a first embodiment of a spin-valve transistor according to the prior art.
Figure 3:
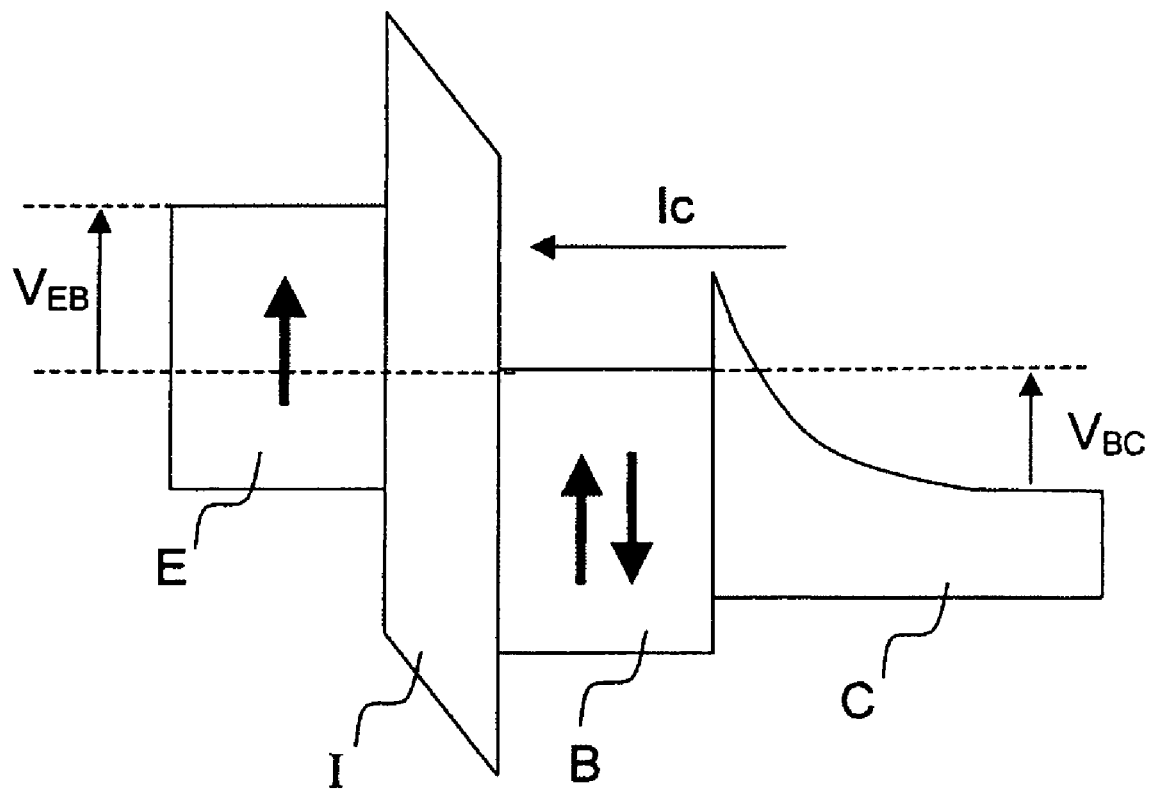
FIG. 3 represents the symbolic diagram of an MTT-type spin-valve transistor according to the prior art according to a first variant.
Figure 4:
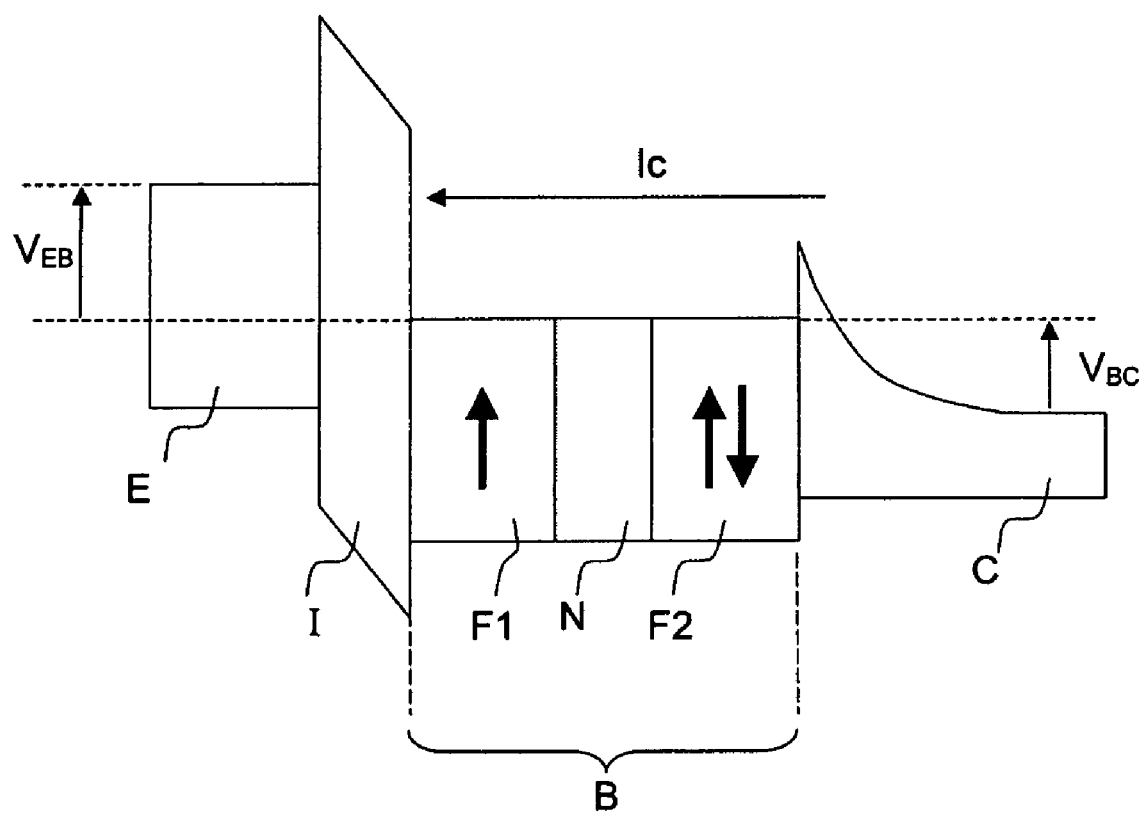
FIG. 4 represents the symbolic diagram of an MTT-type spin-valve transistor according to the prior art according to a second variant.
Figure 5:
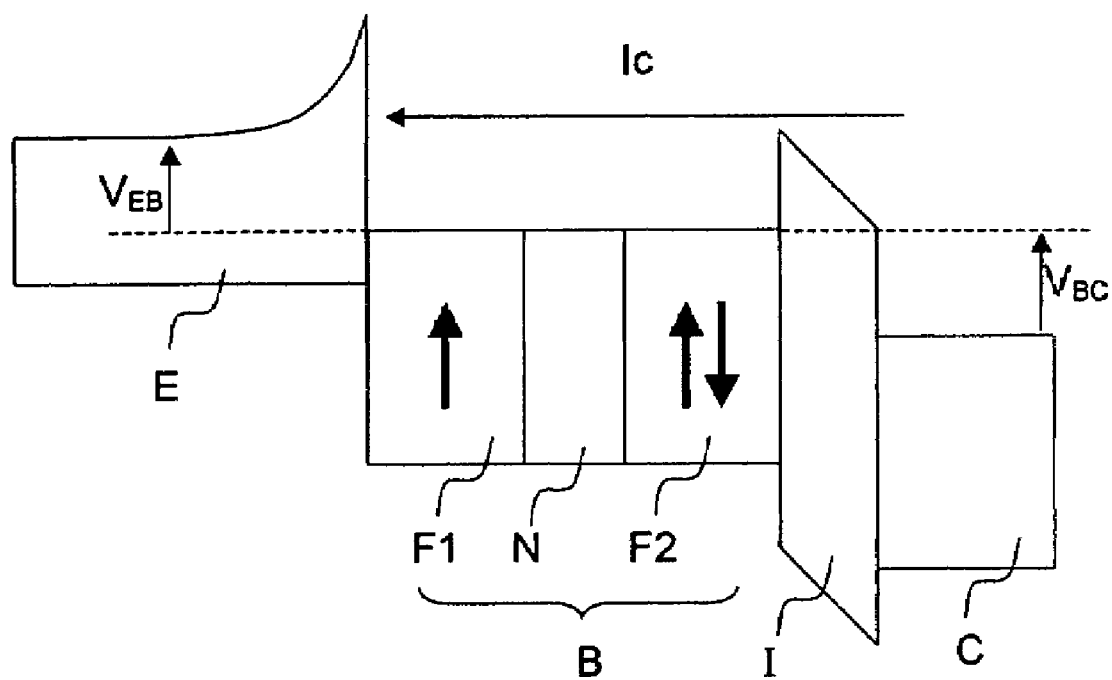
FIG. 5 represents the symbolic diagram of a spin-valve transistor according to the invention.

FIG. 5 represents a symbolic diagram of the spin-valve transistor according to the invention. It comprises an emitter E of semiconductor material, a metallic base B made up of three layers F1, N and F2 forming a spin valve, an insulating material I and a collector C of electrically conductive material. The emitter/base junction is of Schottky type as indicated in FIG. 5. The arrow indicates the direction of the collected current. Electrons are injected from the emitter to the base through the emitter/base Schottky junction. The electrons pass from the base B to the collector C through the insulator I either by tunnel effect or ballistically. This arrangement has two major advantages over the prior arrangements. The use of a Schottky type emitter/base junction allows higher emitter/base voltages $V_{EB}$ to be used, no longer limited by the breakdown phenomenon. It is thus possible to obtain high emitter currents $I_E$ and, consequently, high collector currents $I_C$. Since the base is formed by a spin valve, the MC contrast of the collector current can also assume high values.

To optimize the device, the materials must be chosen to obtain both a high-level Schottky barrier and a low-level tunnel barrier, lower than the Schottky barrier level. The insulator can in particular be made of tantalum oxide or zinc sulfide or of zirconium oxide or of a rare earth oxide such as yttrium oxide. The material of the emitter is conventionally a semiconductor material such as silicon or gallium arsenide. The material layers forming the base are, in particular, cobalt or a cobalt alloy for the ferromagnetic layer F1, copper or gold for the neutral layer N, a nickel and iron alloy such as permalloy (with 80% nickel) for the ferromagnetic layer F2, and finally the conductive layer can be of copper or gold.

The collector current $I_C$ is the sum of two currents: $I_{tunnel}$, tunnel current between base and collector, and $I_{ballistic}$, ballistic current from the emitter made up of the electrons having sufficient energy to pass through the Schottky junction and then the base without relaxing. Since the tunnel current serves no purpose in the operation of the transistor, it should be minimized. In conventional electronics, it corresponds to a leakage current. The simplest means is to thicken the insulator I used as a tunnel barrier between the base and the collector, the tunnel current decreasing exponentially with this thickness.

It is also advantageous to use an emitter/base voltage $V_{EB}$ greater than the level of the tunnel barrier. In this case, a significant portion of the electrons can pass over the tunnel barrier to reach the collector ballistically. Thus, the level of the collector current is increased.

Figure 6:
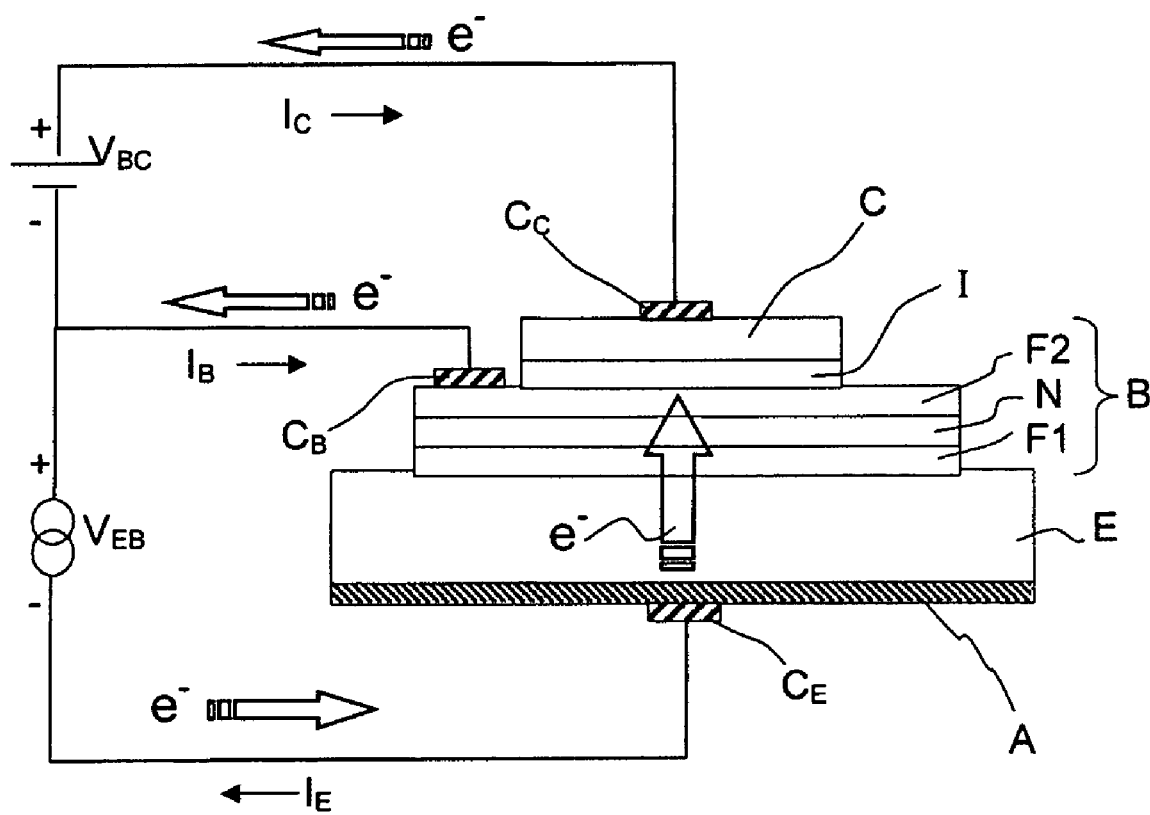
FIG. 6 represents the arrangement of the various layers of said transistor and the associated electrical connections of the transistor according to the invention.

Technologically, the spintronic transistor according to the invention is presented as a stack of layers as represented in FIG. 6. This stack can be produced by deposition methods used in conventional microelectronics. It comprises, successively, a metallic layer A, the semiconductor layer of the emitter E, the three metallic layers F1, N and F2 forming the base, the layer of insulating material I and the metallic layer C of the collector. The electrical connection of the emitter, the base and the collector are provided by connection means $C_E$, $C_B$ and $C_C$ which can, for example, be metallic terminals. These connection means $C_E$, $C_B$ and $C_C$ are located on the level of the metallic layer A located under the emitter E, on the level of the base and on the layer C of the collector. The connection can be made at the level of the base on any one of the three layers F1, N or F2. FIG. 6 also shows an electrical polarization diagram of the transistor. A current generator linked to the transistor by the connection means $C_E$ and $C_B$ imposes a current $I_E$ on the input of the emitter and a voltage $V_{EB}$ between the emitter and the base. A voltage generator linked to the transistor by the connection means $C_C$ and $C_B$ imposes a voltage $V_{BC}$ between the base and the collector. The current collected by the collector depends on the configuration of the magnetizations imposed on the ferromagnetic layers of the base.

It will be readily seen by one of ordinary skill in the art that the present invention fulfills all of the objects set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A spin-valve transistor comprising:
   an emitter,
   a base,
   and a collector, wherein
   the emitter being made of a semiconductor material, the base comprising three successive metal layers, the first layer and the third layer being ferromagnetic, the second layer not being ferromagnetic, the interface between the emitter and the layers of the base forming a Schottky diode, wherein the collector is metallic and separated from the base by a thin insulating layer of approximately a few nanometers, said layer forming a tunnel-effect barrier between the base and said collector, wherein
   the electrical voltage applied between the emitter and the base via the connection means and is greater than the potential barrier of the insulating layer, wherein a collector current is the sum and a tunnel current between the base and the collector means and the ballistic current from the emitter and the collector current has sufficient energy to pass through the base and the Schottky diode without relaxing.

2. The spin-valve transistor as claimed in claim 1, wherein the insulating layer presents a lower-level potential barrier than the potential barrier of the Schottky diode existing between the emitter and the base.

3. The spin-valve transistor as claimed in claim 2, wherein the insulating layer is made of tantalum oxide or of zinc sulfide or of zirconium oxide or of a rare earth oxide such as yttrium oxide.

4. The spin-valve transistor as claimed in claim 1, wherein the insulating layer has a thickness of approximately between 1 and 4 nanometers.

5. The spin-valve transistor as claimed in claim 4, wherein the layer of semiconductor material of the emitter comprises at least a second layer of metallic material.

6. The spin-valve transistor as claimed in claim 4, comprising: electrical connection means connected to the emitter, base, and collector layers and are placed on top on the level of the first layer of metallic material, on the level of the second layer of metallic material and of any one of the layers of the base, said connection means being used to apply external voltages and currents to the transistor.

7. The spin-valve transistor as claimed in claim 1, wherein the emitter comprises at least one layer of semiconductor material and the collector at least a first layer of metallic material.

8. The spin-valve transistor as claimed in claim 7, comprising: electrical connection means is connected to the emitter, base, and collector layers and placed on top on the level of the first layer of metallic material, on the level of the second layer of metallic material and of any one of the layers of the base, said connection means being used to apply external voltages and currents to the transistor.

\* \* \* \* \*